United States Patent
Kim et al.

(10) Patent No.: US 12,431,380 B2
(45) Date of Patent: Sep. 30, 2025

(54) ELECTROSTATIC CHUCK AND METHOD OF MANUFACTURING THE SAME

(71) Applicant: TEMNEST INC., Hwaseong-si (KR)

(72) Inventors: Hae Ran Kim, Hwaseong-si (KR); Young Jae Jeon, Yongin-si (KR); Jae Hyun Lee, Yongin-si (KR)

(73) Assignee: TEMNEST INC., Hwaseong-si (KR)

(*) Notice: Subject to any disclaimer, the term of this patent is extended or adjusted under 35 U.S.C. 154(b) by 234 days.

(21) Appl. No.: 18/320,770

(22) Filed: May 19, 2023

(65) Prior Publication Data
US 2023/0377934 A1   Nov. 23, 2023

(30) Foreign Application Priority Data

May 19, 2022   (KR) .................. 10-2022-0061375

(51) Int. Cl.
| | | |
|---|---|---|
| *H01T 23/00* | (2006.01) | |
| *C04B 35/575* | (2006.01) | |
| *C04B 35/645* | (2006.01) | |
| *C04B 37/00* | (2006.01) | |
| *C04B 37/02* | (2006.01) | |
| *C22C 29/06* | (2006.01) | |
| *H01L 21/683* | (2006.01) | |

(52) U.S. Cl.
CPC ........ *H01L 21/6833* (2013.01); *C04B 35/575* (2013.01); *C04B 35/645* (2013.01); *C04B 37/008* (2013.01); *C04B 37/028* (2013.01); *C22C 29/065* (2013.01); *C04B 2235/3891* (2013.01); *C04B 2235/402* (2013.01); *C04B 2235/656* (2013.01); *C04B 2237/365* (2013.01); *C04B 2237/402* (2013.01)

(58) Field of Classification Search
None
See application file for complete search history.

(56) References Cited

U.S. PATENT DOCUMENTS

| | | | | |
|---|---|---|---|---|
| 9,120,704 | B2 * | 9/2015 | Tsutsumi | ............ H01L 21/6831 |
| 2021/0242062 | A1 * | 8/2021 | Jung | ................. H01L 21/67103 |
| 2022/0359256 | A1 * | 11/2022 | Kwon | ..................... B23Q 3/15 |

FOREIGN PATENT DOCUMENTS

| | | | |
|---|---|---|---|
| JP | 4164255 B2 * | 10/2008 | ......... H01L 21/6833 |
| KR | 10-2009-0048449 | 5/2009 | |
| KR | 10-1016612 | 2/2011 | |
| KR | 10-2012-0078270 | 7/2012 | |
| KR | 10-2017-0141340 | 12/2017 | |

* cited by examiner

*Primary Examiner* — Stephen W Jackson
(74) *Attorney, Agent, or Firm* — KILE PARK REED & HOUTTEMAN PLLC

(57) ABSTRACT

The present disclosure relates to an electrostatic chuck and a method of manufacturing the same. A problem in that the yield of a wafer is reduced due to a partial destruction phenomenon attributable to thermal expansion of an electrostatic chuck is solved and the lifespan of a wafer is increased by making a coefficient of thermal expansion of a lower plate of an electrostatic chuck similar to a coefficient of thermal expansion of an upper plate of the electrostatic chuck.

8 Claims, 6 Drawing Sheets

ELECTROSTATIC CHUCK AND METHOD OF MANUFACTURING THE SAME

BACKGROUND

1. Technical Field

The present disclosure relates to an electrostatic chuck made of a sintering material in which aluminum and other materials have been composed, among sintering materials that are used as materials for a susceptor or chuck in which a wafer is seated within a furnace or chamber that is used in a semiconductor manufacturing process, and a method of manufacturing the same.

2. Related Art

An integrated circuit manufacturing process for a semiconductor wafer is a representative multi-step process, and is performed from at least tens of steps to several hundreds of steps. A semiconductor manufacturing process is basically performed within a high-temperature and high-pressure chamber for each wafer. A finished product is gradually produced by repeating a fine processing process under various chambers and various environments. Representative process steps include steps, such as deposition, exposure, etching, and ion implantation. By repeating such processes under various conditions, active elements, such as a transistor or a diode, are generated within a silicon substrate and various types of conductive layers that connect the active elements or insulating layers are repeatedly formed on the silicon substrate. As described above, such a process in the wafer state is basically performed within a semiconductor manufacturing facility or a chamber within the facility. This is called a pre-process. A furnace, a processing apparatus, a reaction chamber, or a processing chamber may be used instead of the chamber.

In order to generate a desired chemical reaction on the wafer in the state in which various temperatures and pressure set for each process step in order to perform the pre-process have been applied, various types of gases are input to the chamber through a shower head. Sometimes, plasma is generated by using the various types of gases. The wafer within the chamber needs to be seated and fixed so that the wafer is not moved while the process is performed. A structure that is used for the seating and fixing of the wafer is a chuck. The chuck may have various forms or shapes, if necessary. Recently, an electrostatic chuck (ESC) tends to be used a lot. The ESC means a chuck type in which a wafer can be fixed to a chuck by an electrostatic force that is generated by applying a static voltage to the chuck. Such an ESC is basically used to horizontally fix and seat a semiconductor wafer and is also used to horizontally fix a glass substrate of an LCD having a large size.

When power is supplied to the ESC through an electrode embedded in the ESC after a semiconductor wafer is input to the chamber and seated in the ESC, static electricity is generated on a surface of the ESC, and chucking in which the wafer is firmly fixed to the ESC is performed. One step of the pre-process under a high temperature and high pressure is performed. After the process of one step is completed, when the power that is supplied to the ESC is blocked, dechucking in which the wafer is separated from the ESC is performed. Accordingly, the wafer can be separated from the ESC.

In general, in a manufacturing process that is performed within the chamber, as a chemical material is input to the chamber, a chemical reaction under a high temperature and high pressure is generated. Sometimes, the manufacturing process may be performed in a plasma state. Such a process is repeated innumerably until a separate maintenance and repair period is reached. Therefore, the ESC also needs to have high durability, high corrosion resistance, and a high insulating characteristic. It is essentially required that a coefficient of thermal expansion and thermal conductivity are also adjusted within proper standards.

A common electrostatic chuck (ESC) 100 illustrated in FIG. 1 includes an upper plate 120 in which a wafer 200 is seated through direct contact with the wafer 200, a lower plate 130 that is bonded to the upper plate 120, and an adhesive 150 for bonding the plates together. The upper plate 120 is made of ceramic having a thin thickness of approximately 1 mm to 5 mm in order to facilitate the transfer of heat to the wafer 200. A material, such as epoxy, is used as the adhesive 150. A material containing a metal component is used a lot as the lower plate 130 for the transfer of heat to the ESC 100. However, the upper plate 120 and the lower plate 130 have different coefficients of thermal expansion due to different materials. In a chamber environment in which a change in the temperature is severe, the upper plate 120 and the lower plate 130 are spaced apart from each other to the extent that the adhesive is torn, or a destruction problem in which the upper plate is broken additionally occurs. As a result, other problems are additionally caused in terms of maintenance, a repair, and the yield.

For example, the upper plate made of ceramic has a coefficient of thermal expansion (CTE) of approximately 0.4 to 13.5 [$\mu m/^\circ C.$], whereas the lower plate made of aluminum has a CTE of 20 to 30 [$\mu m/^\circ C.$]. Therefore, the greater the difference between a temperature when the upper plate and the lower plate are bonded and combined and a temperature in an environment for a process that is performed within the chamber, the bonding of the upper plate and the lower plate is more likely to be broken or the upper plate made of ceramic is more likely to be broken. The reason for this is that the upper plate made of ceramic is harder than the lower plate made of aluminum and is softer than the lower plate made of aluminum. If a difference between the temperatures is 100° C. even through simple calculation based on thermal expansion, a difference attributable to a change in the sizes of the upper plate and the lower plate may be greater than 1,000 µm. This becomes a great problem.

In particular, an etch process or a plasma process at a temperature lower than a room temperature becomes more important because the aspect ratio of a structure that is vertically formed in a semiconductor integrated circuit is recently several tens to hundreds. Accordingly, such a temperature adaptability problem in the ESC in which a temperature of the wafer is directly adjusted becomes more serious.

For reference, known coefficients of thermal expansion of magnesia (MgO), alumina ($Al_2O_3$), soda-lime glass, and silica ($SiO_2$) that belong to ceramic are about 13.5, 7.6, 9.0, and 0.4 [$\mu m/^\circ C.$], respectively, and have some errors depending on a measurement environment and a degree of impurities contained.

A problem attributable to a difference in the CTE is the same even in a below zero environment in which a temperature gradually drops from a room temperature in a use environment. The CTE refers to a numerical value that is increased whenever a temperature rises every 1° C. When a temperature drops every 1° C., thermal contraction occurs, and the CTE becomes a negative (−) value.

SUMMARY

Various embodiments are directed to a construction which makes a coefficient of thermal expansion of a lower plate of an electrostatic chuck equivalent to or at least approximate to a coefficient of thermal expansion of an upper plate of the electrostatic chuck, and a method of manufacturing the same.

Also, various embodiments are directed to enabling a user to reduce costs and the time for maintenance and repairs by further extending the lifespan of an electrostatic chuck.

Also, various embodiments are directed to preventing a problem in which the yield of a wafer is reduced due to a partial destruction phenomenon attributable to thermal expansion of an electrostatic chuck.

In an embodiment, there is provided an electrostatic chuck including an upper plate made of ceramic and having a wafer seated therein, a lower plate bonded to the upper plate, and an adhesive for bonding the upper plate and the lower plate together. The lower plate may be sintered and molded at a high temperature under vacuum and pressurization by mixing first powder including at least one of aluminum, stainless steel (SUS), titanium, and magnesium and second powder including at least one of silicon-carbide (SiC), silicon nitride ($Si_3N_4$), silicon, diamond, carbon nanotubes, and graphene. A mixing ratio of the first powder and the second powder may be 4:6 to 6:4.

In an embodiment, there is provided a method of manufacturing an electrostatic chuck including an upper plate made of ceramic and having a wafer seated therein, a lower plate bonded to the upper plate, and an adhesive for bonding the upper plate and the lower plate together. The lower plate may be manufactured by a first step of preparing first powder including at least one of aluminum, stainless steel, titanium, and magnesium, a second step of preparing second powder including at least one of silicon-carbide (SiC), silicon nitride ($Si_3N_4$), silicon, diamond, carbon nanotubes, and graphene, a third step of mixing the first powder and the second powder, and a fourth step of producing a molding body of the lower plate by sintering and molding the mixed powder at a high temperature under vacuum and pressurization. A ratio of the first powder and the second powder that are mixed in the third step may be 4:6 to 6:4.

The present disclosure has an effect in that a user can reduce costs and the time for maintenance and repairs by further extending the lifespan of an ESC.

The present disclosure has effects in that it can prevent a problem in which the yield of a wafer is reduced by minimizing a partial destruction phenomenon attributable to thermal expansion of an ESC and can improve productivity in a semiconductor mass-production process.

DETAILED DESCRIPTION

Figure 1:
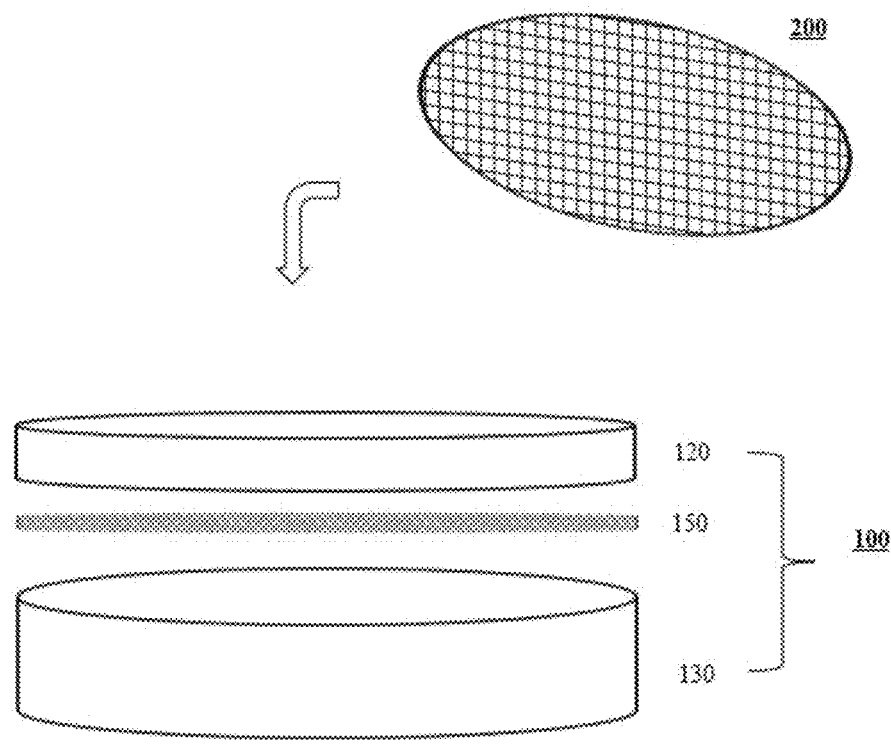
FIG. 1 is a diagram schematically illustrating a common ESC according to a conventional technology.

Hereinafter, embodiments of the present disclosure are described in detail with reference to the accompanying drawings so that a person having ordinary knowledge in the art to which the present disclosure pertains may easily practice the embodiments. In reference numerals presented in the drawings, the same reference number indicates the same member.

In describing the present disclosure, when it is determined that a detailed description of a related known technology may obscure the subject matter of the present disclosure, the detailed description is omitted.

Terms, such as a first and a second, may be used to describe various components, but the components are not restricted by the terms. The terms are used to only distinguish one component from another component.

Figure 2:
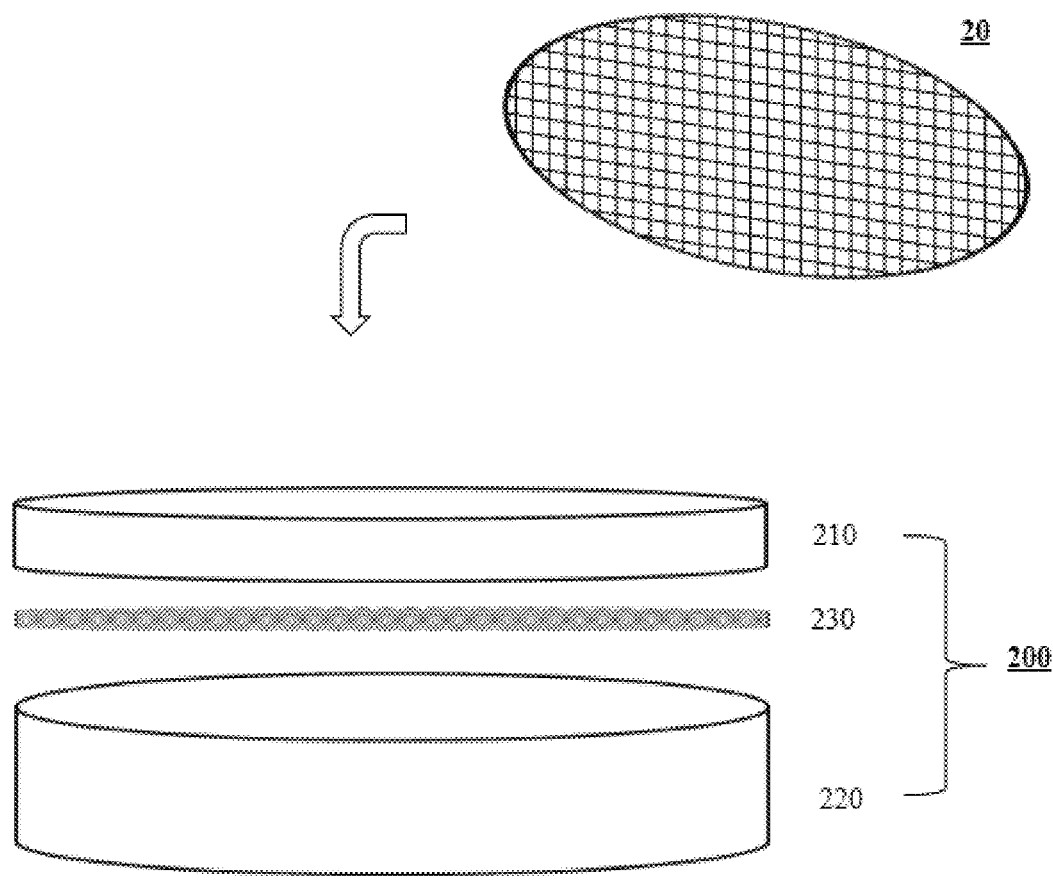
FIG. 2 is a diagram schematically illustrating an ESC according to an embodiment of the present disclosure.
Figure 3:
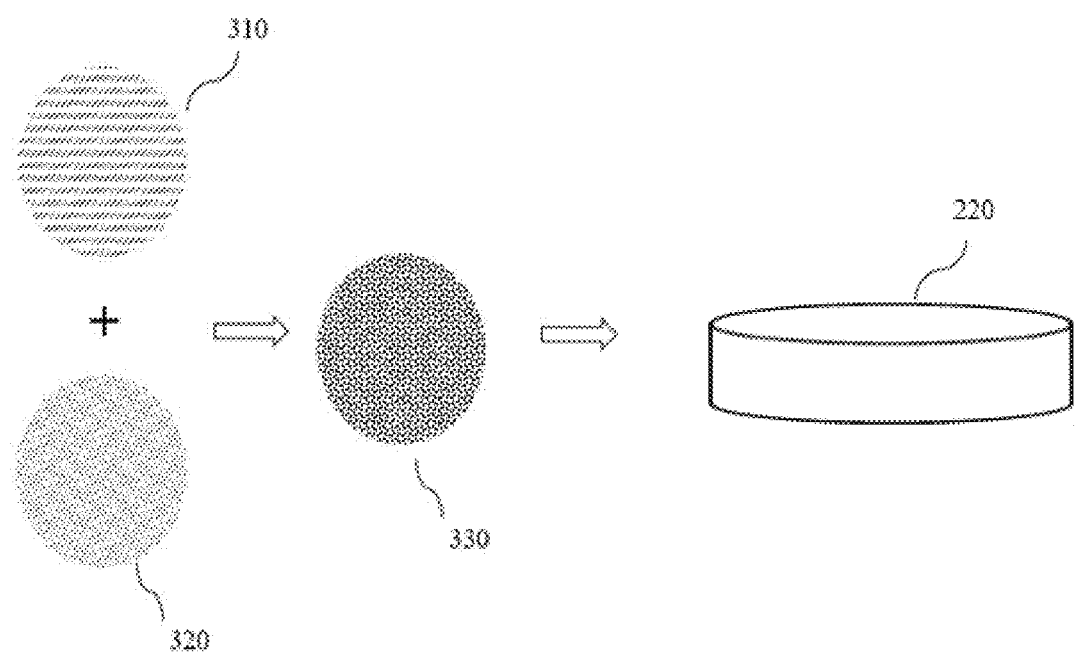
FIG. 3 is a diagram illustrating a process of forming a lower plate of the ESC in FIG. 2.

FIG. 2 is a diagram schematically illustrating an electrostatic chuck (ESC) according to an embodiment of the present disclosure. FIG. 3 is a diagram illustrating a process of forming a lower plate of the ESC in FIG. 2.

Referring to FIG. 2, an ESC 200 according to an embodiment of the present disclosure includes an upper plate 210 in which a wafer 20 is seated through direct contact with the wafer 20, a lower plate 220 that is bonded to the upper plate 210, and an adhesive 230 for bonding the upper plate 210 and the lower plate 220 together.

The upper plate 210 is made of ceramic having a thin thickness of approximately 1 mm to 5 mm in order to facilitate the transfer of heat to the wafer 20. A material, such as epoxy, is used as the adhesive 230. A material containing a metal component is used a lot as the lower plate 220 for the transfer of heat to the ESC 200.

The ESC 200 according to an embodiment of the present disclosure can solve a problem in that the adhesive is torn or the upper plate is broken by making a coefficient of thermal expansion of the lower plate 220 identical with a coefficient of thermal expansion of the upper plate 210 or minimizing a difference between the coefficients of thermal expansion of the lower plate 220 and the upper plate 210.

In the ESC 200 according to an embodiment of the present disclosure, the lower plate 220 is sintered and molded at a high temperature under vacuum and pressurization by mixing first powder including at least one of aluminum, stainless steel, titanium, and magnesium and second powder including at least one of silicon-carbide (SiC), silicon nitride ($Si_3N_4$), silicon, diamond, carbon nanotubes, and graphene. In this case, it is preferred that the mixing ratio of the first powder and the second powder is 4:6 to 6:4.

In order to make a coefficient of thermal expansion of the lower plate 220 identical with a coefficient of thermal expansion of the upper plate 210 or minimize a difference between the coefficients of thermal expansion of the lower plate 220 and the upper plate 210, it is very important to adjust the ratio of the particle size of the first powder and the second powder in addition to the mixing ratio of the first powder and the second powder.

In the ESC 200 according to an embodiment of the present disclosure, it is preferred that the ratio of the particle size of the first powder and the second powder of the lower plate 220 is adjusted in the range of 1:0.05 to 1:0.4.

It is preferred that the lower plate 220 is sintered and molded at a temperature of 300° C. to 700° C. and pressure of 10 MPa to 300 MPa for 30 minutes to 2 hours.

Figure 4:
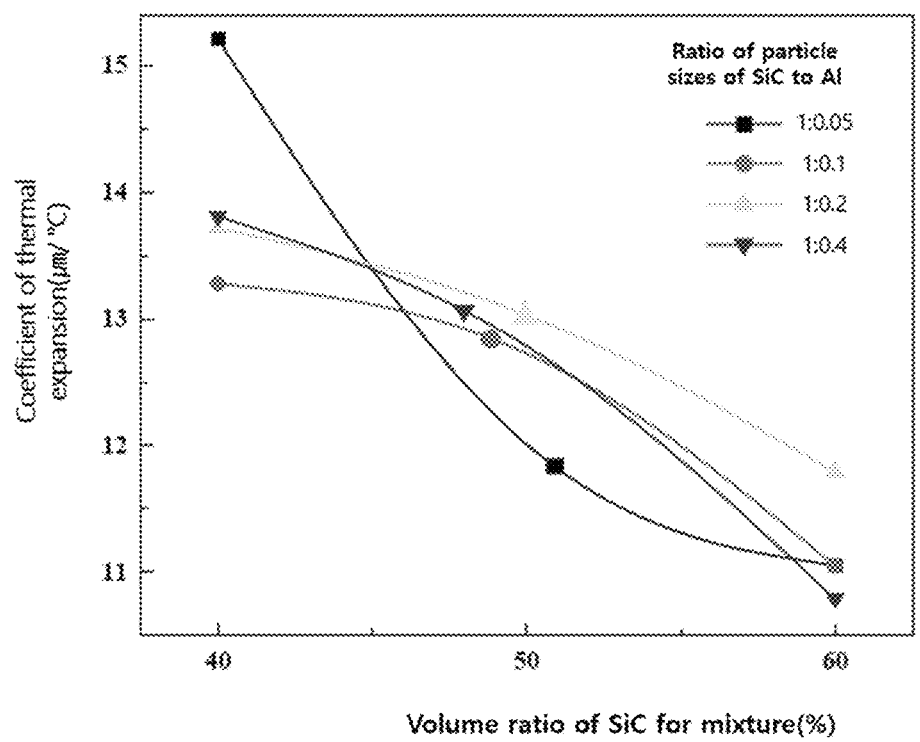
FIG. 4 is a diagram illustrating coefficients of thermal expansion according to composition ratios of a composition of the lower plate of the ESC according to an embodiment of the present disclosure.

FIG. 4 is a diagram illustrating coefficients of thermal expansion according to composition ratios of a composition of the lower plate of the ESC according to an embodiment of the present disclosure.

In FIG. 4, an example in which Al6061, that is, an aluminum alloy, was used as the first powder and silicon-carbide (SiC) was used as the second powder has been described, but the first powder and the second powder are not limited to the example.

Referring to FIG. 4, it may be seen that a coefficient of thermal expansion of the composition is in the range of 10.79 (μm/m ° C.) to 15.21 (μm/m ° C.) if the ratio of silicon-carbide (SiC), that is, the second powder, to a mixture of the aluminum alloy (Al6061) and silicon-carbide (SiC) is in the range of 40 to 60 volume % and if the ratio of the particle size of silicon-carbide (SiC), that is, the second powder, to the aluminum alloy (Al6061), that is, the first powder, is in the range of 1:0.05 to 1:0.4.

The results of FIG. 4 are indicated in the form of a table as follows.

TABLE 1

|  | Ratio of particle size of SiC to Al | | | |
|---|---|---|---|---|
|  | 1:0.05 | 1:0.1 | 1:0.2 | 1:0.4 |
| Volume ratio (%) of SiC 40 | 15.21 | 13.28 | 13.72 | 13.81 |
| 50 | 11.45 | 13.01 | 13.17 | 13.03 |
| 60 | 11.05 | 11.05 | 11.79 | 10.79 |

The lower plate having a coefficient of thermal expansion within a preferred range can be obtained if the ratio of the particle size of silicon-carbide (SiC), that is, the second powder, to the aluminum alloy (Al6061), that is, the first powder, is adjusted in the range of 1:0.05 to 1:0.4 and the ratio of silicon-carbide (SiC), that is, the second powder, is adjusted in the range of 40 to 60 volume %.

In this case, if the ratio of the particle size of silicon-carbide (SiC), that is, the second powder, to the aluminum alloy (Al6061), that is, the first powder, is less than 1:0.05, there is a problem in that a heat transfer coefficient is suddenly reduced because the density and dispersibility of the powers is deteriorated and the density is reduced after sintering. Furthermore, if the ratio of the particle size of silicon-carbide (SiC), that is, the second powder, to the aluminum alloy (Al6061), that is, the first powder, is greater than 1:0.4, there is a problem in that the coefficient of thermal expansion is reduced because a bonding force between the particles is reduced.

TABLE 2

| Mixture | Coefficient of thermal expansion ($10^{-6}$/K) |
|---|---|
| Al-1% SiC (ratio of particle sizes 1:0.2) | 22.29 |
| Al-5% SiC (ratio of particle sizes 1:0.2) | 23.46 |
| Al-10% SiC (ratio of particle sizes 1:0.2) | 22.56 |
| Al-20% SiC (ratio of particle sizes 1:0.2) | 21.12 |
| Al-30% SiC (ratio of particle sizes 1:0.2) | 19.98 |
| Al-40% SiC (ratio of particle sizes 1:0.2) | 13.72 |
| Al-50% SiC (ratio of particle sizes 1:0.2) | 13.17 |
| Al-60% SiC (ratio of particle sizes 1:0.2) | 11.79 |
| Al-70% SiC (ratio of particle sizes 1:0.2) | 10.12 |
| Al-80% SiC (ratio of particle sizes 1:0.2) | 10.01 |

Table 2 illustrates the results of experiments on a characteristic change according to the ratio of silicon-carbide (SiC) for the mixture of the aluminum alloy (Al6061), that is, the first powder, and silicon-carbide (SiC), that is, the second powder.

From Table 2, it may be seen that when the ratio of silicon-carbide (SiC) for the mixture of the aluminum alloy (Al6061) and silicon-carbide (SiC) is 40% or less, a desired coefficient of thermal expansion cannot be obtained and when the ratio of silicon-carbide (SiC) for the mixture of the aluminum alloy (Al6061) and silicon-carbide (SiC) is more than 40%, the coefficient of thermal expansion is suddenly improved.

When the ratio of silicon-carbide (SiC) for the mixture of the aluminum alloy (Al6061) and silicon-carbide (SiC) is more than 60%, a characteristic distribution of the powders is deteriorated because the dispersibility of the powders, that is, a process of the powders being uniformly mixed, is reduced.

Figure 5:
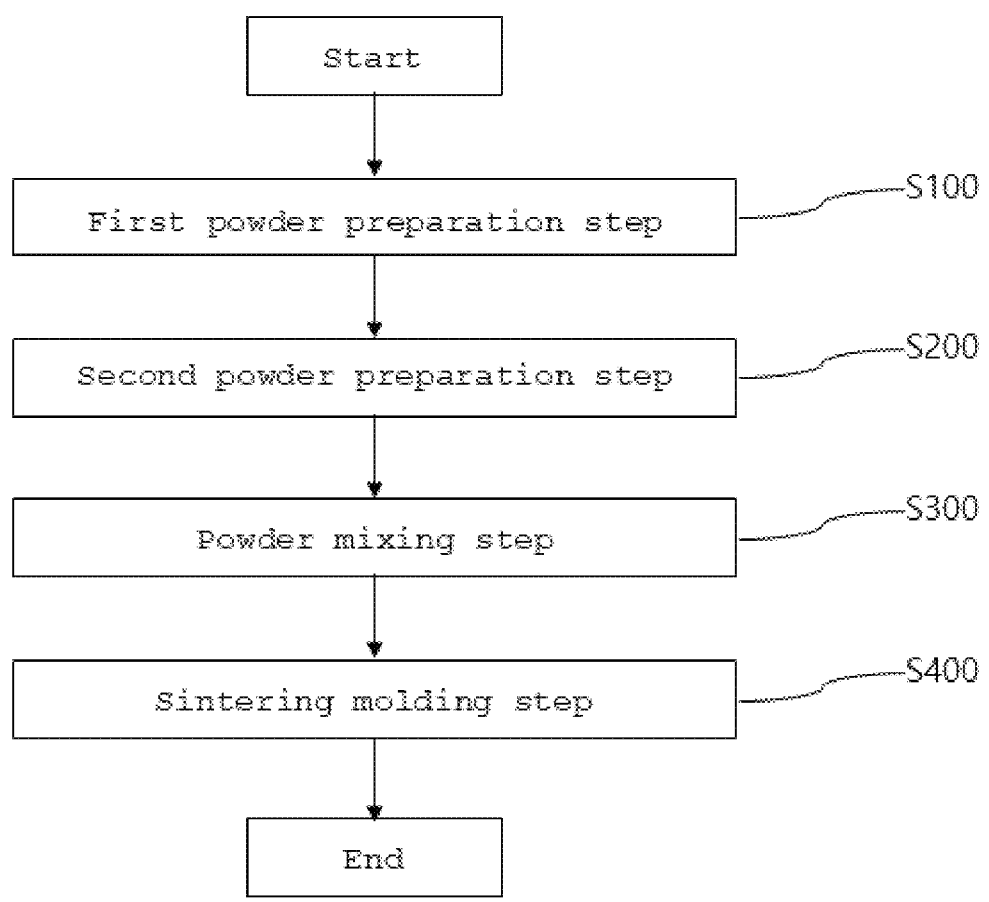
FIG. 5 is a diagram illustrating a flow of a method of manufacturing an ESC according to an embodiment of the present disclosure.

FIG. 5 is a diagram illustrating a flow of a method of manufacturing an ESC according to an embodiment of the present disclosure.

Referring to FIG. 5, the method of manufacturing an ESC according to an embodiment of the present disclosure includes a first powder preparation step S100, a second powder preparation step S200, a powder mixing step S300, and a sintering molding step S400.

In the first powder preparation step S100, first powder 310, that is, molding body powder including at least one of aluminum, stainless steel, titanium, and magnesium, is prepared. When the ease of molding processing is considered, it is preferred that the prepared first powder includes aluminum as a major component of the material of the first powder. For reference, pure aluminum has a coefficient of thermal expansion of 23.8 [μm/° C.], alumina ($Al_2O_3$) has a coefficient of thermal expansion of 6.7 to 7.7 [μm/° C.], and aluminum-nitride (AlN) has a coefficient of thermal expansion of 4.5 to 5.0 [μm/° C.]. Hereinafter, the unit of a coefficient of thermal expansion is [μm/° C.].

In the second powder preparation step S200, second powder 320, that is, additive powder including at least one of silicon-carbide (SiC), silicon nitride ($Si_3N_4$), silicon, diamond, carbon nanotubes, and graphene, is prepared.

In the second powder 320, that is, additive powder, silicon-carbide (SiC) has a coefficient of thermal expansion of 4.5 to 6.6, silicon nitride ($Si_3N_4$) has a coefficient of thermal expansion of 2.6, stainless steel (SUS) has a coefficient of thermal expansion of 10 to 18 depending on standards thereof, diamond has a coefficient of thermal expansion of about 1.1, and carbon nanotubes have a coefficient of thermal expansion of 4 to 6 depending on a direction thereof and the content of fine carbon.

In the powder mixing step S300, the first powder 310, that is, the molding body powder, and the second powder 320, that is, the additive powder, are mixed. As an embodiment, Al6061, that is, an aluminum alloy, may be used as the first powder 310, and silicon-carbide (SiC) may be used as the second powder 320. In this case, it is preferred that the ratio of the particle size of the first powder and the second powder that are mixed is 1:0.05 to 1:0.4.

In this case, the volume of the second powder 320, that is, additive powder, may be properly adjusted, if necessary. For example, if silicon-carbide (SiC) is used as the second powder 320, the volume of silicon-carbide (SiC) may be increased or decreased within 40% to 60% of the entire mixed powder 330. If Al6061, that is, an aluminum alloy, is used as the first powder 310, a coefficient of thermal expansion of the mixed powder is gradually reduced from a coefficient of thermal expansion of aluminum depending on a mixed ratio thereof. Since it is expected that the second powder that is used as an additive is mixed with the first powder, it is preferred that a material that is advantageous in being pressurized and molded at a high temperature and that more facilitates the adjustment and prediction of a coefficient of thermal expansion of the material is selected as the second powder.

In the sintering molding step S400, the lower plate 220 is completed by molding the mixed powder as a sintering material by pressurizing the mixed powder. In this case, conditions for such sintering molding, that is, pressure, a temperature, and the time, are variable depending on a state of a desired finished sintering material. Preferably, it is better to perform the sintering molding at pressure of 10 MPa to 300 MPa and a temperature of 300° C. to 700° C. for 30 minutes to 2 hours. The sintering molding step S400 may be performed by using a cold press or a high pressure injection method.

In some cases, in order to adjust a temperature of the lower plate, an electrode needs to be buried in the lower plate. In this case, after a mold of the lower plate is divided by half and the two molds are separately manufactured, the electrode needs to be buried between the two molds.

Figure 6:
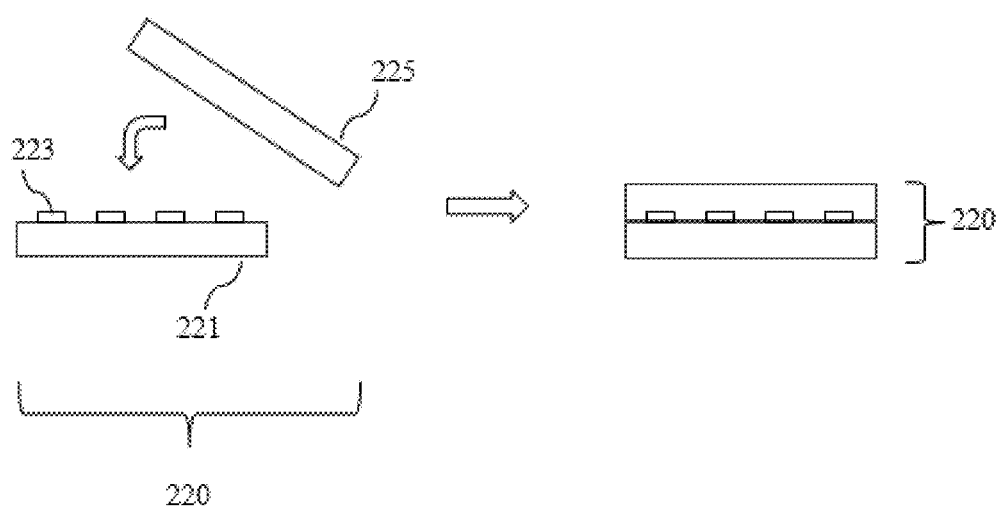
FIG. 6 is a diagram for describing a process of forming the lower plate in which an electrode has been buried in the ESC according to an embodiment of the present disclosure.

FIG. 6 is a diagram for describing a process of forming the lower plate in which the electrode has been buried in the ESC according to an embodiment of the present disclosure.

That is, as illustrated in FIG. 6, after the lower plate 220 is divided by half, that is, an upper part 225 and a lower part 221, and the upper part 225 and the lower part 221 are individually formed by using the method including the first powder preparation step S100, the second powder preparation step S200, the powder mixing step S300, and the sintering molding step S400, an electrode 223 is printed or coated on the lower part 221 or is disposed on the lower part 221 by using another method. The electrode 223 is covered with the upper part 225, and pressurization and sintering or compression is then performed, thereby completing the lower plate 220. If necessary, before the electrode 223 is buried in the lower part 221, the lower part 221 and upper part 225 of the lower plate 220 may be selectively molded through simple compression instead of sintering molding at a high temperature, the electrode 223 may be buried in the lower part 221, and sintering molding may be then performed.

In an embodiment of the present disclosure, the sintering molding step may be replaced with another method other than the aforementioned powder metallurgy method of pressurizing and molding the mixed powder. For example, the first powder may be first sintered, and a pouring method of first melting the first powder so that bubbles are properly formed in the first powder may be used. Thereafter, a method of melting the first powder through pressurization and filling the molten results with bubbles may be used. Alternatively, a method of first melting another first powder and then adding the second powder may be used.

What is claimed is:

1. An electrostatic chuck comprising an upper plate made of ceramic and having a wafer seated therein, a lower plate bonded to the upper plate, and an adhesive for bonding the upper plate and the lower plate together,
    wherein the lower plate is sintered and molded at a high temperature under vacuum and pressurization by mixing first powder comprising at least one of aluminum, stainless steel, titanium, and magnesium and second powder comprising at least one of silicon-carbide (SiC), silicon nitride ($Si_3N_4$), silicon, diamond, carbon nanotubes, and graphene, and
    a mixing ratio of the first powder and the second powder is 4:6 to 6:4,
    wherein a ratio of a particle size of the first powder and the second powder is 1:0.05 to 1:0.4, and
    wherein a coefficient of thermal expansion of the lower plate is $12*10^{-6}$/K to $13*10^{-6}$/K.

2. The electrostatic chuck of claim 1, wherein the lower plate is sintered and molded at a temperature of 300° C. to 700° C.

3. The electrostatic chuck of claim 1, wherein the lower plate is sintered and molded at pressure of 10 MPa to 300 MPa.

4. The electrostatic chuck of claim 1, wherein the lower plate is sintered and molded for 30 minutes to 2 hours.

5. A method of manufacturing an electrostatic chuck comprising an upper plate made of ceramic and having a wafer seated therein, a lower plate bonded to the upper plate, and an adhesive for bonding the upper plate and the lower plate together,
    wherein the lower plate is manufactured by:
    a first step of preparing first powder comprising at least one of aluminum, stainless steel, titanium, and magnesium;
    a second step of preparing second powder comprising at least one of silicon-carbide (SiC), silicon nitride ($Si_3N_4$), silicon, diamond, carbon nanotubes, and graphene;
    a third step of mixing the first powder and the second powder; and
    a fourth step of producing a molding body of the lower plate by sintering and molding the mixed powder at a high temperature under vacuum and pressurization, and
    a ratio of the first powder and the second powder that are mixed in the third step is 4:6 to 6:4,
    wherein a ratio of a particle size of the first powder and the second powder is 1:0.05 to 1:0.4, and
    wherein a coefficient of thermal expansion of the lower plate is $12*10^{-6}$/K to $13*10^{-6}$/K.

6. The method of claim 5, wherein the fourth step is performed at a temperature of 300° C. to 700° C.

7. The method of claim 5, wherein the fourth step is performed at pressure of 10 MPa to 300 MPa.

8. The method of claim 5, wherein the fourth step is performed for 30 minutes to 2 hours.

* * * * *